May 14, 1963 R. S. FOOTE 3,089,962

TRANSISTOR MONOSTABLE MULTIVIBRATOR

Filed Aug. 29, 1958

INVENTOR

Robert S. Foote

BY Stevens, Davis, Miller & Mosher

ATTORNEYS

United States Patent Office 3,089,962

Patented May 14, 1963

3,089,962

TRANSISTOR MONOSTABLE MULTIVIBRATOR

Robert S. Foote, Richardson, Tex., assignor to Texas Instruments Incorporated, Dallas, Tex., a corporation of Delaware Filed Aug. 29, 1958, Ser. No. 758,151
13 Claims. (Cl. 307—88.5)

This invention relates to semiconductor device circuits and in particular to semiconductor device circuits wherein semiconductor devices made of different semiconductor materials are employed in the same circuit.

Since the discovery of transistor action, a substantial quantity of the development of circuitry employing semiconductor devices has been patterned along the lines of the circuitry involving vacuum devices. However, this type of circuitry generally employs only one of the unique physical characteristics of semiconductor devices that are useful in circuitry, whereas, as the art of semiconductor devices develops, it becomes apparent that there are great circuit advantages to be gained through the use of more of the physical characteristics peculiar to the semiconductor device itself in order to achieve the functions of the circuit.

This invention is directed to the use of semiconductor devices in circuitry wherein certain physical characteristics that are gained from the materials of the devices themselves are employed to achieve the functions of the circuit.

It is an object of this invention to provide a technique of constructing semiconductor circuitry wherein the forward potential difference across a semiconductor device of one semiconductor material is employed as a part of the potential difference required to provide conduction in a semiconductor device of another semiconductor material having an energy band gap greater than the energy band gap of the first semiconductor device.

It is another object of this invention to provide direct coupled semiconductor device circuitry wherein conduction in a first active element conditions but does not initiate conduction in a second active element.

It is another object of this invention to provide an improved control for a time constant controlled circuit.

It is another object of this invention to provide an improved transistor multivibrator circuit.

It is another object of this invention to provide a complementary output, transistor monostable multivibrator.

It is another object of this invention to provide a transistor multivibrator with an improved recovery time.

It is another object of this invention to provide a transistor multivibrator having a minimum number of components.

It is another object of this invention to provide a technique of sensing current flow variations at the output of one active element in a multistage circuit without substantially affecting the input of a subsequent stage to which the output being sensed is connected.

These, and other objects which will become apparent to one skilled in the art, are illustrated in the accompanying description in the form of a transistor multivibrator circuit which embodies several novel aspects and in which the physical characteristics of the devices and the materials from which they are made operate to achieve some of the circuit functions.

In the field of semiconductor technology there are a number of materials from which circuit devices may be manufactured. As examples of these materials, the monatomic semiconductors such as germanium and silicon and the 3–5 intermetallics such as indium antimonide, are, at present, the better known. One of the differences between these materials is the difference between the valence energy band and the conduction energy band in the material. This difference is known in the art as the energy band gap width of the material. The energy band gap width of silicon is greater than that of germanium. It has been found that for a semiconductor device made of a material having a larger energy band gap width, more energy is required to initiate conduction than is required by a semiconductor device having a smaller energy band gap width. Semiconductor devices of one material have been found to have different forward voltage differences than semiconductor devices of another material. In the following illustration this is employed so that the potential difference across a semiconductor device as a result of conduction is employed as a part of, but not a sufficient amount of, the potential required to initiate conduction in a subsequent stage having a direct coupled semiconductor device of a material having a greater energy band gap width.

Figure 1:
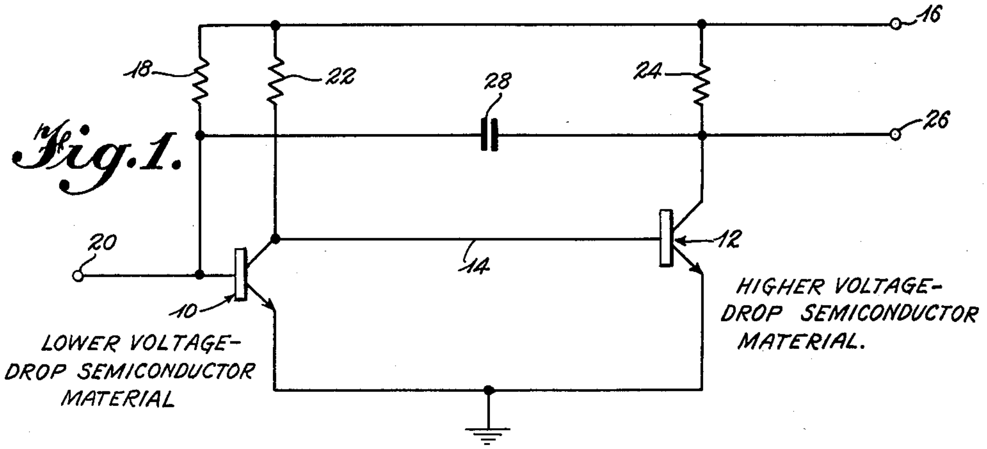
FIGURE 1 is a direct coupled transistor multivibrator circuit illustrating the invention.

In the description of FIGURE 1 the monatomic semiconductor materials silicon and germanium have been selected as examples of materials and the multivibrator circuit has been described in terms of actual signal values in order to more clearly point out the effects in the circuit achieved by the physical characteristics of the devices themselves.

Referring now to FIGURE 1, there is shown a pair of active elements illustrated as transistors 10 and 12 employed in the grounded emitter configuration and direct coupled by way of a line 14 between the collector of transistor 10 and the base of transistor 12. The transistor 10 is of the germanium crystal variety, while the transistor 12 is of the silicon crystal type, but it is pointed out and will become evident from the following description that the only requirement for selection of the two semiconductor devices is that the characteristics differ such that the forward drop of transistor 10 is insufficient to forward bias the transistor 12. A suitable voltage such as a positive 9.2 volts is supplied to a terminal 16 and the negative side of the supply is connected to ground. A resistor 18 having a value of 27 kilohms is connected between the terminal 16 and the base of the input transistor 10, the latter forming the input to the circuit via a terminal 20. A resistor 22 having a value of 3.9 kilohms is connected between the terminal 16 and the line 14 for supplying voltage to the collector of transistor 10 and the base of transistor 12. A resistor 24, having a value of 2.2 kilohms, is connected between the terminal 16 and the collector of transistor 12, the latter forming the output of the circuit via a terminal 26. A timing condenser 28 having a value selected for the desired output pulse duration, for example, 50 micro-microfarads, is connected between the terminals 20 and 26.

The values of the components, the magnitude of the voltage, and the characteristics of the transistors are such that in the circuit of FIGURE 1, the transistor 10 is conducting with 0.2 volt existing on the collector in the absence of a signal at the input terminal 20. This voltage on line 14 with respect to ground is below the turn-on voltage of the transistor 12 which is normally biased off. Accordingly, the output terminal 26 is at the voltage of terminal 16. When a negative voltage greater than 0.5 volt is applied at the input terminal 20, transistor 10 is cut off and the voltage at line 14 rises, thereby turning on transistor 12, which goes to saturation and drops the voltage at the output terminal 26 to a low value. Since the output terminal 26 is connected to the input terminal 20 by way of the condenser 28, the negative going voltage is felt at the input and keeps the transistor 10 cut off even though the input pulse at terminal 20 is removed. As determined by the time constant involving the condenser 28 and the resistance of the network, the voltage at terminal 20 rises to the point where transistor 10 begins to conduct once again. The potential on line 14 drops accordingly, and the voltage at terminal 26 rises as conduction of transistor 12 diminishes and the condenser 28 charges toward the voltage of the terminal 16. Finally, the circuit returns to the stable state where transistor 10 is conducting and transistor 12 is cut off.

It will be apparent that what has been shown, in addition to a highly reliable multivibrator using a minimum of components, is a multistage, direct coupled, semiconductor device circuit, wherein one stage can be conducting and yet by proper choice of materials for the semiconductor devices involved, it need not cause conduction in a subsequent stage to which it is connected, without any intervening potential level shifting equipment.

Figure 2:
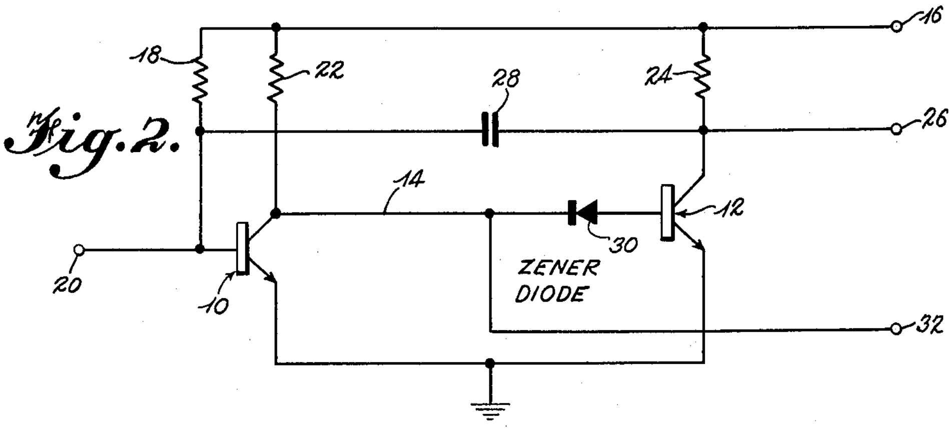
FIGURE 2 is a complementary output transistor multivibrator circuit illustrating another aspect of the invention.

In FIGURE 2, a circuit is illustrated which is identical with the one of FIGURE 1 except that a Zener diode 30 has been inserted in the line 14 and an output terminal 32 is provided from the collector of transistor 10. The Zener diode 30 has a breakdown voltage of about two volts less than the supply voltage at terminal 16 and is used for purposes of supplying complementary output pulses of equal amplitude at terminals 26 and 32 and of making the rise and fall of voltage at terminal 32 independent of the time constant involving the condenser 28 and the resistance of the network. As a result, the rise and fall times of the pulses are decreased and substantially square wave outputs are provided. In FIGURE 2, from a functional standpoint, the Zener diode permits the sensing of current flow variations in the output of one stage of a circuit without appreciably affecting the input to a subsequent stage to which it is connected directly. It will be apparent that it is necessary that the breakdown voltage of the Zener diode 30 not be greater than the potential variation appearing at the point in the circuit in which the sensing is to take place.

Figure 3:
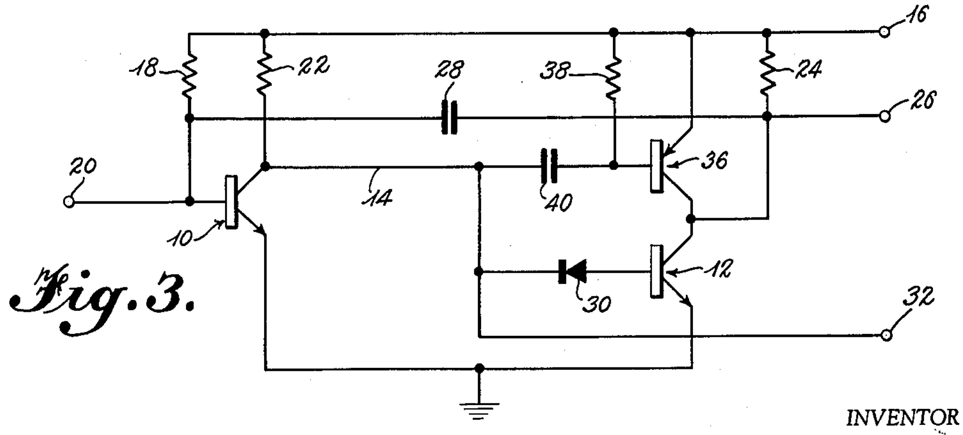
FIGURE 3 is a complementary output transistor multivibrator circuit with a time constant control illustrating still another aspect of the invention.

The fall time of the pulse at terminal 26 can be reduced by the circuit of FIGURE 3 which is the basic circuit with a transistor clamp added in the following manner: A transistor 36 of the germanium crystal type has its collector connected to the output terminal 26 and its emitter connected to the supply voltage terminal 16. It will be recognized that this connection places the emitter to collector current path of transistor 36 in parallel with the resistor 24. In this illustration a transistor of opposite conductivity type from that of transistor 12 is used in order to be compatible with signals of a particular polarity, however, it will be apparent from the following description that the function of the transistor 36, in providing time constant control by providing a low impedance path across the resistive element in a resistive—capactive network is independent of conductivity type of the transistor employed other than for circuit compatibility considerations. A resistor 38 having a value of 10 kilohms is connected between the supply voltage terminal 16 and the base of the transistor 36, and a coupling condenser 40 is connected between the base of transistor 36 and the collector of transistor 10 (line 14). Normally, the transistors 10 and 36 are conducting and the transistor 12 is cut off. Therefore, the resistor 24 is very nearly shorted out and the output terminal 26 is almost at the voltage of the terminal 16. Upon the application of a negative going pulse at the input terminal 20, transistor 10 is cut off and its collector goes more positive. The increase in positive voltage is applied to the output terminal 32, the Zener diode 30 and the coupling condenser 40, thereby turning on transistor 12 and turning off transistor 36. When transistor 36 is turned off, the presence of resistor 24 is felt in the circuit of transistor 12 and in the input circuit of transistor 10 by way of condenser 28. When transistor 10 begins to conduct once again, the line 14 at the collector of the transistor 10 is brought down sharply, transistor 36 is turned on shorting out resistor 24, and the output terminal 26 goes rapidly to its most positive voltage. From the description it is apparent that the transistor 36 no only clamps the output at terminal 26 but also adjusts the time constant during the dynamic portions of the operating cycle.

While there has been illustrated a monostable multivibrator circuit it will be apparent that the circuit structure itself serves to illustrate the application of certain semiconductor circuit principles wherein the physical characteristics of the devices involved achieve some of the circuit functions so that many variations and changes in structure may readily be practiced by one skilled in the art within the spirit of the invention.

What is claimed is:

1. An electrical circuit comprising first and second stages, said first stage including an active element of a first semiconductor material having at least an input, an output and a common electrode operatively associated therewith, said second stage including an active element of a second semiconductor material having an energy band gap width greater than the energy band gap width of the active element of said first stage and having at least an input, an output and a common electrode operatively associated therewith, whereby the forward potential drop across said first stage is insufficient to forward bias said second stage, means coupling the input electrode of each active element to the same potential value to forward bias said first stage and means connecting the output electrode of said first stage to the input electrode of said second stage.

2. The electrical circuit of claim 1 wherein said first semiconductor material is germanium and said second semiconductor material is silicon.

3. An electrical circuit comprising first and second circuit stages, said first stage including an active element of a first semiconductor material having at least an input, an output and a common electrode operatively associated therewith, said active element in said first stage having a potential difference between said output and said common electrodes during conduction of a first value, said second stage including an active element of a second semiconductor material having at least an input, an output and a common electrode operatively associated therewith, said active element in said second stage requiring a potential difference between said input and said common electrodes for conduction of a value greater than said first value, means coupling the input electrode of each active element to the same potential to bias said first stage conductive and means directly connecting the output electrode of said first active element to the input electrode of said second active element.

4. The electrical circuit of claim 3 wherein said first active element is a germanium transistor and said second active element is a silicon transistor.

5. The electrical circuit of claim 3, including capacitive means coupling the output electrode of said second stage to the input electrode of said first stage for rendering said first stage nonconductive for a predetermined time period in response to conduction of said second stage.

6. An electrical circuit comprising a first transistor of a material having a first energy band gap width and having at least emitter, base and collector electrodes, a reference potential, means connecting the emitter electrode of said first transistor to said reference potential, a power source, a first impedance, means connecting the collector of said first transistor through said first impedance to said power source, a second impedance having one terminal thereof connected to said power source and having the remaining terminal thereof connected to the base electrode of said first transistor to forward bias said first transistor, a second transistor of a material having a second energy band gap width greater than said first band energy gap width so that the forward potential drop at the collector electrode of said first transistor is insufficient to forward bias said second transistor, and having emitter, base and collector electrodes, means connecting the emitter electrode of said second transistor to said reference potential, a third impedance, means coupling the collector electrode of said second transistor through said third impedance to said power source, means connecting the collector of said first transistor to the base of said second transistor, a capacitor having a first terminal connected to the base electrode of said first transistor and having the remaining terminal thereof connected to the collector electrode of said second transistor, means introducing current flow to the base of said first transistor and means sensing current flow in the collector of said second transistor.

7. The circuit of claim 6 wherein said first transistor is of germanium and said second transistor is of silicon.

8. The circuit of claim 6 wherein said means connecting the collector of said first transistor to the base of said second transistor comprises a Zener diode connected to oppose current flow from the collector of said first transistor to the base of said second transistor, said Zener diode having a breakdown voltage less than the voltage of said power source and means sensing current flow in the collector of said first transistor.

9. The circuit of claim 8 wherein said means coupling the collector electrode of said second transistor through said third impedance to said power source includes the emitter to collector current path of a third transistor of opposite conductivity type to said second transistor connected in parallel with said third impedance, a fourth impedance connected between the base of said third transistor and said power source and capacitive coupling between the collector of said first transistor and the base of said third transistor.

10. The circuit of claim 9 wherein said first transistor is of germanium, and said second transistor is of silicon.

11. A transistor monostable multivibrator circuit comprising a source of power, a reference potential, a first transistor having a first difference of potential between collector and emitter thereof when conducting current, maens connecting the emitter of said first transistor to said reference potential, a first impedance, means connecting the collector of said first transistor through said first impedance to said source of power, a second impedance, means connecting the base of said first tranistor through said second impedance to said source of power, a second transistor having a second difference of potential between base and emitter thereof when conducting current, said second difference of potential being greater than said first difference of potential, means connecting the emitter of said second transistor to said reference potential, a third impedance, means connecting the collector of said second transistor through said third impedance to said source of power, a capacitor, means connecting said capacitor between the base of said first transistor and the collector of said second transistor and means connecting a Zener diode between the collector of said first transistor and the base of said second transistor to oppose current flow between the collector of said first transistor and the base of said second transistor, said Zener diode having a breakdown voltage less than the potential variation at the collector of said first transistor.

12. The multivibrator of claim 11 including a third transistor having the collector thereof connected to the collector of said second transistor, means connecting the emitter of said third transistor to said source of power, said third transistor being of a conductivity type opposite to said second transistor, a fourth resistor resistor connected between the base of said third transistor and said source of power and a second capacitor connected between the collector of said first transistor and the base of said third transistor.

13. A transistor monostable multivibrator comprising first and second transistors, bias means coupling the base and collector electrodes of said transistors to a potential source and the emitter electrode of said transistors to a reference potential so that said first transistor is forward biased, means directly coupling the collector of said first transistor to the base of said second transistor, the second transistor material having a greater energy band gap width than the first so that the forward potential drop at the collector of said first transistor is insufficient to forward bias said second transistor, and capacitive means coupling the collector of said second transistor to the base of said first transistor.

References Cited in the file of this patent

UNITED STATES PATENTS

| | | |
|---|---|---|
| 2,569,345 | Shea | Sept. 25, 1951 |
| 2,641,717 | Toth | June 9, 1953 |
| 2,770,732 | Chong | Nov. 13, 1956 |
| 2,772,359 | Modiano | Nov. 27, 1956 |
| 2,828,450 | Pinckaers | Mar. 25, 1958 |
| 2,837,663 | Walz | June 3, 1958 |
| 2,842,624 | Marsh | July 8, 1958 |
| 2,854,590 | Wolfe | Sept. 30, 1958 |
| 2,874,315 | Reichert | Feb. 17, 1959 |
| 2,879,412 | Hodge | Mar. 24, 1959 |
| 2,880,330 | Linvill et al. | Mar. 31, 1959 |

OTHER REFERENCES

Sulzer: Publication "Junction Transistor Circuit Applications Electronics," August 1953, pages 170–173.

Shea: "Book Transistor Circuits Engineering," copyright 1957, John Wiley & Sons Inc., New York, page 336.